(12) United States Patent
O'Hare et al.

(10) Patent No.: US 9,701,045 B2
(45) Date of Patent: Jul. 11, 2017

(54) METHOD FOR MAKING, INKING, AND MOUNTING STAMPS FOR MICRO-CONTACT PRINTING

(75) Inventors: Jonathan J. O'Hare, Oakdale, MN (US); Richard W. Greger, St. Paul, MN (US); Mikhail L. Pekurovsky, Bloomington, MN (US); Daniel P. Meehan, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 377 days.

(21) Appl. No.: 14/116,376

(22) PCT Filed: Jun. 27, 2012

(86) PCT No.: PCT/US2012/044317
§ 371 (c)(1),
(2), (4) Date: Nov. 8, 2013

(87) PCT Pub. No.: WO2013/003412
PCT Pub. Date: Jan. 3, 2013

(65) Prior Publication Data
US 2014/0110879 A1    Apr. 24, 2014

Related U.S. Application Data

(60) Provisional application No. 61/503,220, filed on Jun. 30, 2011.

(51) Int. Cl.
*B29C 33/42*   (2006.01)
*B41K 1/28*   (2006.01)
(Continued)

(52) U.S. Cl.
CPC ............ *B29C 33/424* (2013.01); *B41K 1/28* (2013.01); *B82Y 10/00* (2013.01); *B82Y 40/00* (2013.01);
(Continued)

(58) Field of Classification Search
CPC ........................... B81C 99/009; B29C 33/424
See application file for complete search history.

(56) References Cited

U.S. PATENT DOCUMENTS 3,019,201 A  *  1/1962  Clancy et al. ................. 264/122
3,603,250 A  *  9/1971  Knudsen ......................... 101/36
(Continued)

FOREIGN PATENT DOCUMENTS

| EP | 1 542 074 | 6/2005 |
|---|---|---|
| NL | 1033461 | 8/2008 |

(Continued)

OTHER PUBLICATIONS

Ulman, "Formation and Structure of Self-Assembled Monolayers," American Chemical Society, Chemical Reviews, vol. 96, No. 4, pp. 1533-1554, 1996.

(Continued)

*Primary Examiner* — Larry Thrower
(74) *Attorney, Agent, or Firm* — Adrian L. Pishko; James A. Baker (57) ABSTRACT

A method of preparing a patterned micro-contact printing stamp for micro contact printing including the making of a submaster of e.g. epoxy, against which a micro-contact printing stamp from polydimethylsiloxane or other stamp forming material can be formed. The micro-contact printing stamp can then be exposed to an inking material while the micro-contact printing stamp is still against the submaster, resulting in a micro-contact printing stamp capable of making numerous impressions before the inking material is exhausted.

22 Claims, 4 Drawing Sheets

(51) Int. Cl.
 B82Y 40/00 (2011.01)
 G03F 7/00 (2006.01)
 H05K 3/12 (2006.01)
 B82Y 10/00 (2011.01)

(52) U.S. Cl.
 CPC ......... *G03F 7/0002* (2013.01); *H05K 3/1275* (2013.01)

(56) References Cited

U.S. PATENT DOCUMENTS

| | | | |
|---|---|---|---|
| 5,512,131 | A | 4/1996 | Kumar |
| 5,620,777 | A | 4/1997 | Goto |
| 5,817,242 | A | 10/1998 | Biebuyck |
| 5,937,758 | A | 8/1999 | Maracas |
| 6,656,308 | B2 | 12/2003 | Hougham |
| 6,772,686 | B2 | 8/2004 | Van Wert |
| 6,817,293 | B2 * | 11/2004 | Fujihira et al. ............ 101/401.1 |
| 8,221,665 | B2 * | 7/2012 | Rudmann et al. ............ 264/227 |
| 2003/0010241 | A1 | 1/2003 | Fujihira |
| 2003/0127002 | A1 | 7/2003 | Hougham |
| 2004/0150129 | A1 | 8/2004 | Hougham |
| 2006/0021533 | A1 * | 2/2006 | Jeans .......................... 101/327 |
| 2007/0261574 | A1 * | 11/2007 | Kendale et al. ................ 101/17 |
| 2009/0025595 | A1 * | 1/2009 | Mayers et al. ................ 101/492 |
| 2010/0200146 | A1 * | 8/2010 | Zhu et al. .................... 156/62.2 |
| 2011/0126730 | A1 | 6/2011 | Berniard |

FOREIGN PATENT DOCUMENTS

| | | |
|---|---|---|
| WO | WO 2009/067241 | 5/2009 |
| WO | WO 2013/003253 | 1/2013 |

OTHER PUBLICATIONS

Pellerite et al., "Effects of Fluorination on Self-Assembled Monolayer Formation from Alkanephosphonic Acids on Aluminum: Kinetics and Structure," Journal of Physical Chemistry B, vol. 107, Issue 42, pp. 11726-11736, 2003.

PCT International Search Report, PCT/US2012/044317, 3 pages.

Wilbur, et al., "Microfabrication by Microcontact Printing of Self-Assembled Monolayers," Advanced Materials, vol. 6, No. 7/8, (1994), pp. 600-604.

Supplementary European Search Report, EP Application No. 12805189, Feb. 4, 2015, 4 pages.

* cited by examiner

METHOD FOR MAKING, INKING, AND MOUNTING STAMPS FOR MICRO-CONTACT PRINTING

CROSS REFERENCE TO RELATED APPLICATIONS

This application is a national stage filing under 35 U.S.C. 371 of PCT/US2012/044317, filed Jun. 27, 2012, which claims priority to Provisional Application No. 61/503,220, filed Jun. 30, 2011, the disclosure of which is incorporated by reference in its/their entirety herein.

The present invention is related to the preparation and mounting of stamps used in micro contact printing.

BACKGROUND

It is known to employ high resolution micro-contact printing to produce fine patterns on a flexible web. One of the unique characteristics of the articles created by micro-contact printing are the small scale features the process is capable of generating suitable for use in the electronics industry. Specifically, patterns constructed of lines with line widths smaller than 10 microns having high optical transmission and relatively high electrical conductivity can be prepared over a large area. This small line width size, along with a low density of the lines, is enabled by very fine patterning of the micro-contact printing stamp to produce materials suitable for use as a touch screen.

SUMMARY

Micro-contact printing stamps are typically made by first making a master, usually by a lithographic process, dispensing PDMS onto that master, curing the PDMS and removing completed stamp from the master. The very sensitive nature of photoresist-based masters presents significant challenges related to their handling, as exposure to practically any solvent damages the pattern.

One of the important areas of concern for micro-contact printing is related to the limited dimensional stability of deformable stamps, as handling of the stamp leads to stamp deformation and subsequent deviation of the printed pattern from the intended design. Further complications are related to the nature of the inking material and the mechanism responsible for delivering that inking material to the stamping surface. Generally, the bulk of the inking material in a micro-contact printing stamp resides remote from the printing surface and diffuses to the printing surface during printing. Inking materials are typically thiols, either dissolved in a solvent or as neat liquid. Generally, inking material in either form is applied to the stamp by depositing it on the printing surface of the stamp after the stamp is removed from the master.

Printing with the stamp reduces the concentration of inking materials on the surface of the stamp and induces diffusion of the material from the bulk of the stamp to the printing surface. After some number of prints, the supply of printing material inside the stamp is used up, and printing stops. Thus, it is important to enable the highest possible amount of the inking material to be diffused throughout the stamp.

It has now been determined that an inking material can be applied to a stamp while that stamp in still in contact with the master. Further, it has been determined that a submaster can be prepared and used in the preparation of micro contact printing stamps, and that inking material can be alternatively applied to the stamp while that stamp in still in contact with the submaster. It has further been determined that stamp thickness and the time over which inking material is applied to a stamp can be optimized to produce a maximum number of usable prints from the stamp.

One or more advantages are associated with embodiments of the invention. Inking of the stamp while it is supported by a master, or alternatively by a submaster, allows the stamp to resist tiny but significant dimensional changes while the inking material is diffusing into the stamp. Use of a sacrificial submaster during inking allows for the master to be reused for producing additional submasters. Further, applying the stamp to, e.g. a printing roll while it is still supported by a master or submaster allows the stamp to resist being deformed by small but significant contact forces between the stamp and the roll during the application process. Further, selecting an appropriate thickness for the stamp optimizes the number of prints that can be produced by the stamp. This reduces the expense of using the inventive stamps since they need to be replaced less often. As yet, the reason why the number of prints that can be produced with a stamp does not vary linearly with its thickness is not completely understood. However, stamps capable of making over 2000 impressions have been prepared providing great economic efficiency.

In one aspect the invention provides a method of preparing a patterned micro-contact printing stamp for micro-contact printing comprising: providing a master of the desired pattern; applying stamp forming material to the master; hardening the stamp forming material to form a micro-contact printing stamp, and exposing the micro-contact printing stamp to an inking material while the micro-contact printing stamp is still in contact with the master.

In a second aspect, the invention provides a method of preparing a patterned micro-contact printing stamp for micro contact printing comprising: providing a master of the desired pattern; applying a negative-making material to the master to obtain a negative of the desired pattern; preparing a submaster from the negative, applying stamp forming material to the submaster; hardening the stamp forming material to form a micro-contact printing stamp; and exposing the micro-contact printing stamp to an inking material while the micro-contact printing stamp is still against the submaster.

Unless expressly defined herein, the terminology used to describe the embodiments of the invention will be understood to have the same meaning attributed to them by those skilled in the art. In particular, as used herein, micro-contact printing means a form of soft lithography that uses the relief patterns on a stamp to form patterns of self-assembled monolayers of inking material on the surface of a substrate through conformal contact. A micro-contact printing stamp is a member having raised stamping features with at least one dimension of the contacting surface of the raised stamping feature having a width less than 20, 10, or 5 microns. In many embodiments, a micro-contact printing stamp has a plurality of raised lines for printing electrical circuit patterns and the width of the raised lines and resulting printed traces is less than 20, 10, or 5 microns.

A self-assembled monolayer refers to a single layer of molecules that are attached (e.g., by a chemical bond) to a surface and that have adopted a preferred orientation with respect to that surface. Self-assembled monolayers have been shown to cover surfaces so completely that the properties of that surface are changed. For example, application of a self-assembled monolayer can result in a surface energy reduction.

A photoresist means a light-sensitive material used in industrial processes, such as photolithography and photoengraving to form a patterned coating on a surface. Photoresists are classified into two groups: positive resists and negative resists. A positive resist is a type of photoresist in which the portion of the photoresist that is exposed to light becomes soluble to a photoresist developer. The portion of the photoresist that is unexposed remains insoluble to the photoresist developer.

A negative resist is a type of photoresist in which the portion of the photoresist that is exposed to light becomes insoluble to a photoresist developer. The unexposed portion of the photoresist is dissolved by the photoresist developer.

Those skilled in the art will more fully understand the nature of the invention upon consideration of the remainder of the disclosure, including the Detailed Description, the Examples, and the appended claims.

BRIEF DESCRIPTION OF THE DRAWINGS

In describing the embodiments of the invention, reference is made to the various Figures in which the features of the depicted embodiments are identified with reference numeral with like reference numerals indicating like structures and wherein.

DETAILED DESCRIPTION

Processes according to the present invention start with a master having the desired pattern in relief thereon. If the feature size of the desired pattern is large enough, the pattern can be etched or machined on solid materials such as polymer, metal, or plated metal. When a metal master is used, nickel, nickel-cobalt, or nickel plated copper have been found to be particularly suitable. However, especially when the desired pattern includes features that are particularly small, it is convenient to create the master using traditional photolithography techniques.

When photolithography is to be used, the master is conveniently prepared on a base, which conveniently has a high degree of flatness, so silicon wafer or flat glass are considered particularly suitable. A layer of photoresist is then applied to the surface. Diverse photoresists may be used. In one embodiment, acetate photoresists commercially available as AZ 1500 SERIES photoresists from AZ Electronic Materials of Somerville, N.J. are used. In many convenient embodiments, photoresist is applied to the surface and patterned by the application of a photomask and exposure to UV light, or alternatively by direct laser exposure. The master is typically baked, developed and cleaned before use. The pattern is then conveniently left as a relief of hard, developed, photoresist on the base.

Figure 1:
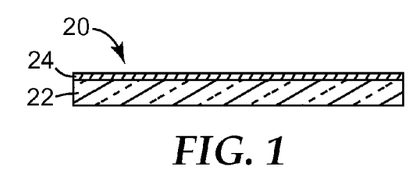
FIG. 1 is a side view of stage in the production of a master having a desired pattern thereon.
Figure 2:
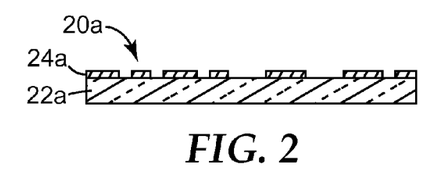
FIG. 2 is a side view of a later stage where the master has a pattern in relief thereon.

Referring now to FIG. 1, a side view of a stage in the production of a master 20 having the desired pattern thereon is illustrated. A base 22 has had a layer of photoresist 24 applied thereon. Referring now to FIG. 2, the photoresist has been exposed, developed, and portions removed, leaving the pattern 24a in relief on the surface of the base 22.

Figure 3:
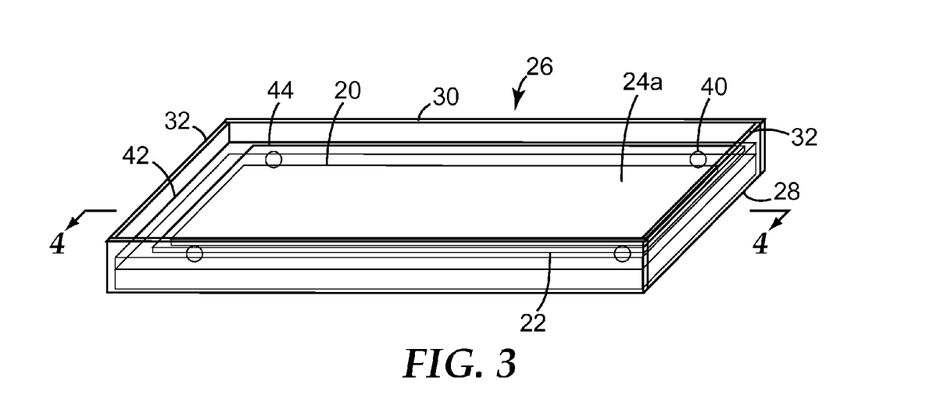
FIG. 3 is a perspective side view of the master of FIG. 2 placed within a tray in preparation for the formation of a negative of the master.

Referring now to FIG. 3, a side perspective view of the master 20 of FIG. 2 is illustrated. It is optional, but convenient, to perform the next part of the process in a shallow, disassemblable tray, pan, or dish with removable sides. Accordingly in this view, the master 20 has been placed inside a shallow tray 26, conveniently formed from a bottom 28, two sides 30, and two ends 32. These components of tray 26 are conveniently made of ordinary glass, though any generally flat inert material could be used. The components of tray 26 are conveniently held together temporarily by a material that releasably forms a liquid-tight adhesive seal (seen as 41 in FIG. 4) between the components of tray 26. Dental impression materials have these convenient characteristics, and in particular impression material commercially available as EXPRESS VPS 7301 from 3M ESPE of St. Paul, Minn., has been found to be suitable.

In this view it can be seen that spacers 40 have been placed in the tray 26 adjacent to the master 20. While diverse objects could be used as spacers 40, precision ground ball bearings have been found to be convenient. Their significance will be appreciated in connection with FIG. 4 below. It is convenient to maintain them in position using the temporary adhesive used to assemble the tray 26.

Figure 4:
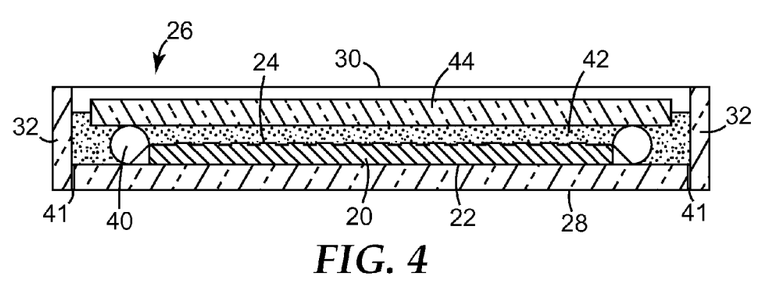
FIG. 4 is a cross section side view of the tray of FIG. 3, taken along section lines 4-4 in FIG. 3, after the addition of material to form the negative.

Referring now to FIG. 4, a cross-section side view of the tray 26 of FIG. 3 taken along section lines 4-4 is illustrated. In this view, the use of temporary adhesive 41 discussed above for assembling the tray 26 and maintaining the spacers 40 can be seen. Also in this view, a layer of negative-making material 42 has been dispensed onto the patterned master 20, and a rigid plate 44 has been placed on the spacers 40. Sufficient material 42 has been dispensed so that it is fully in contact with the plate 44, and in fact submerges it roughly half-way. The negative-making material 42 will form a negative (46 in FIG. 5) of the master 20. The negative-making material 42 is conveniently a polymeric material; and further conveniently the same polymeric material that will be used to form a stamp in a step to be discussed below. Polymeric materials suitable for use in fabrication of negative 42 may have linear or branched backbones, and may be crosslinked or noncrosslinked, depending upon the particular polymer and the degree of formability desired of the stamp. A variety of elastomeric polymeric materials are suitable for such fabrication, especially polymers of the general classes of silicone polymers, epoxy polymers, polyurethane polymers and acrylate polymers. Epoxy polymers are characterized by the presence of a three-member cyclic ether group commonly referred to as an epoxy group, 1,2-epoxide, or oxirane. For example, diglycidyl ethers of bisphenol A may be used, in addition to compounds based on aromatic amine, triazine, and cycloaliphatic backbones.

Examples of silicone elastomers suitable for use as negative-forming material 42 include those formed from precursors including the chlorosilanes such as methylchlorosilanes, ethylchlorosilanes, and phenylchlorosilanes, and the like. A particularly preferred silicone elastomer is polydimethylsiloxane. Exemplary polydimethylsiloxane polymers include those sold under the trademark SYLGARD by the Dow Chemical Company of Midland, Mich., and more particularly SYLGARD 182, SYLGARD 184, and SYLGARD 186 are considered suitable. Elevated temperatures are sometimes convenient to facilitate curing of these polymeric materials. Additional discussion of suitable negative-forming and/or stamp-forming materials can be found in U.S. Pat. No. 5,512,131, "Formation of Microstamped Patterns on Surfaces and Derivative Articles," Kumar, et al., which is hereby incorporated by reference in its entirety.

After the negative-forming material 42 has hardened so as to form a negative 46 (FIG. 5), it is possible to remove both it and the plate 44 from the master 20 by lifting it gently away. This is conveniently accomplished if tray 26 (of FIG. 3) was made of disassemblable components which are at this point disassembled. The plate 44 and the negative 46 adhering to it is then it is turned upside down so that the negative of the master's 20 pattern (24a in FIG. 2) is face up. The result of performing these operations can be visualized by referring now to FIG. 5, where a cross-section side view of a negative 46, conveniently still resting on plate 44 is illustrated. It is an advantage to have the negative 46 on the plate 44, enhancing the dimensional stability of the pattern in negative relief. It is a further advantage that all along the periphery of the negative 46 there is a peripheral ridge 48 of hardened negative-forming material with a flat upper surface formed by contact with bottom 28 (in FIG. 4). This will be appreciated in connection with FIG. 6.

Figure 5:
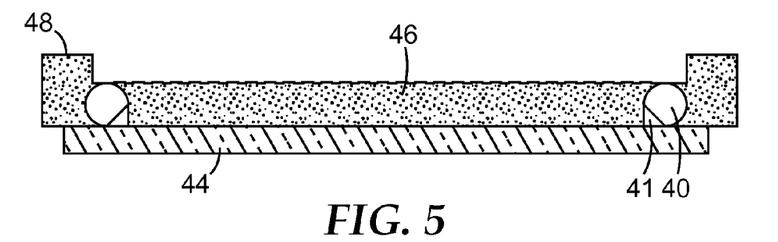
FIG. 5 is a side view of the negative after removal from the master.
Figure 6:
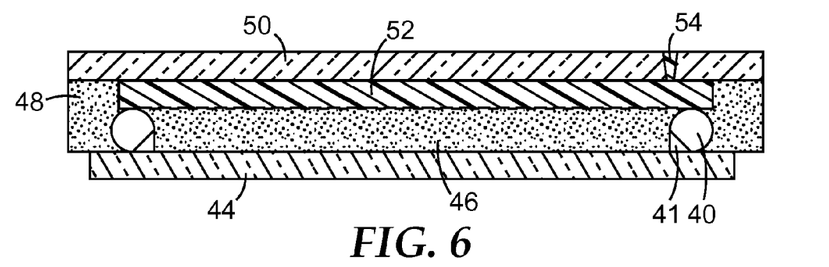
FIG. 6 is a side view of a submaster in the process of being formed against the negative of FIG. 5.

Referring now to FIG. 6, a cross-section side view of a submaster 50 in the process of being formed against the negative 46 of FIG. 5 is illustrated. A submaster support plate 52 has been rested on the raised periphery 48. The submaster support plate 52 has a filling port 54 for the introduction of a substance into the space below the submaster support plate 52 and above the negative 46, so as to form a submaster 50 which has a pattern which is a negative replica of the negative 46 and a positive replica of the master 20. Conveniently, this substance is a hardenable substance resistant to the inking material. A clear two-part epoxy commercially available as SCOTCH-WELD Epoxy Potting Compound DP270 from 3M Company of St. Paul, Minn., has been found to be suitable in many convenient embodiments.

Figure 7:
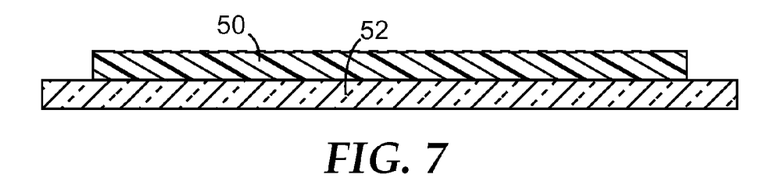
FIG. 7 is a side view of the submaster of FIG. 6 on a submaster support plate.

After the submaster 50 has hardened against negative 46, it can be gently peeled away from the negative 46, together with submaster support plate 52 still supporting it. Referring now to FIG. 7, a side view of the submaster 50 with its supporting plate 52 is illustrated.

Figure 8:
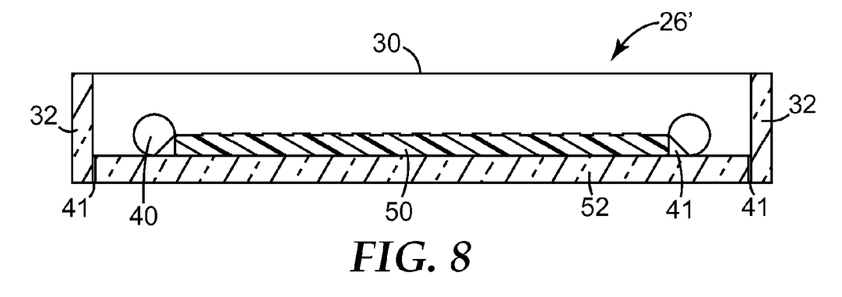
FIG. 8 is a side cross-section view of the submaster of FIG. 7 along with the submaster support plate inside a shallow tray.

It is optional, but convenient, to once again perform the next part of the process in a shallow, disassemblable tray. Referring now to FIG. 8, the submaster support plate 52, with submaster 50 adhered still adhered to it, now forms the bottom of a shallow tray 26', once again conveniently formed from two sides 30, and two ends 32, assembled with temporary adhesive 41 as discussed about in connection with FIG. 3. Once again, spacers 40 have been positioned adjacent to the submaster 50, conveniently maintained in position by the temporary adhesive 41. Since the spacers at this stage define the thickness of the final stamp, choosing their height so as to create a stamp of a convenient thickness has an impact on the process. This will be discussed with more particularity below.

Figure 9:
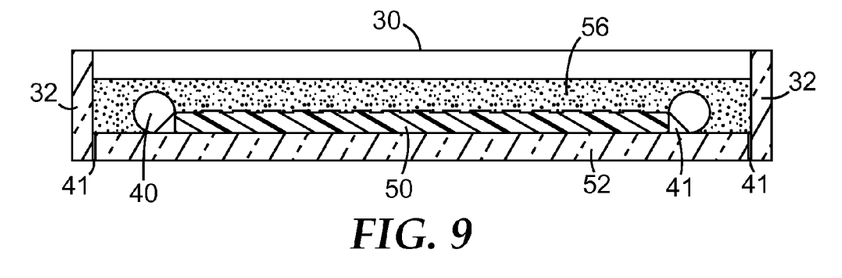
FIG. 9 is a side cross-section view of similar to FIG. 8, except that a quantity of stamp-forming material has been introduced into the tray above the submaster.

Referring now to FIG. 9, a side cross-section view of similar to FIG. 8 is illustrated, except that a quantity of stamp-forming material 56 has been introduced into tray 26 above the submaster 50. Suitable stamp-forming materials 56 are discussed above in connection with FIG. 4 where it was noted that it is convenient to use similar materials for both forming a negative and forming a stamp.

Figure 10:
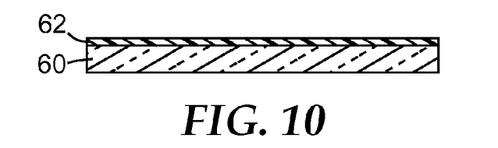
FIG. 10 is a side view of a flat plate with a liner thereon.

Referring now to FIG. 10, a side view of a flat leveler 60 with a liner 62 thereon is illustrated. As will be seen with more particularity in connection with FIG. 11, the leveler 60 is pressed liner 62 side first into the stamp-forming material 56 until it contacts the spacers 40. Leveler 60 is advantageously of a very flat material like silicon wafer or flat glass since it will be used to define the shape of the backside (the side without the pattern) of the stamp 70 that will be formed from the stamp-forming material 56. The liner 62 can be any thin film of polymeric material that clings gently to the leveler 60, preferably without adhesive, and that interacts poorly or not at all with the stamp-forming material 56. A 5 mil (0.13 mm) thick sheet of polyethylene phthalate has been found to be suitable.

Figure 11:
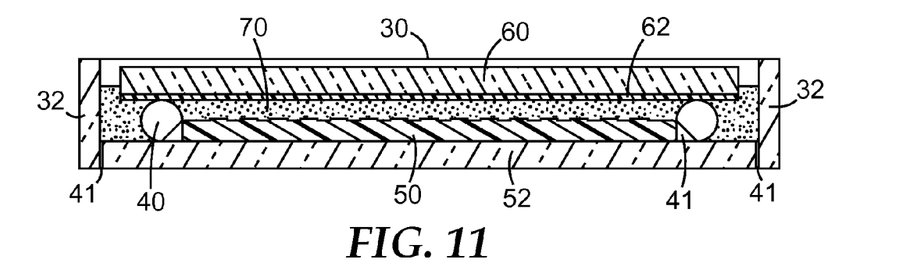
FIG. 11 is a side cross-section view of similar to FIG. 9, except that the plate has been pressed liner side first into the stamp-forming material until the liner contacts the spacers.

Referring now to FIG. 11, a side cross-section view of similar to FIG. 9 is illustrated, except that the leveler 60 has been pressed liner 62 side first into the stamp-forming material 56 until the liner 62 contacts the spacers 40. Once this has been done, the stamp-forming material 56 is allowed to harden into stamp 70.

Figure 12:
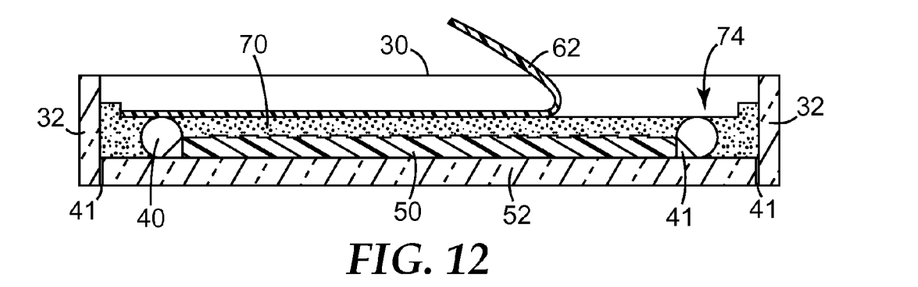
FIG. 12 is a side cross-section view of similar to FIG. 11, except that the plate has been removed and the liner is being peeled away.

Referring now to FIG. 12, a side cross-section view similar to FIG. 11 is illustrated, except that the leveler 60 has been removed. It is for convenience in performing this action that it was desired that the leveler 60 should not be adhered to the liner 62, but only be held by a gentle cling or static attraction. In performing this operation, it is desirable to avoid disrupting the contact between the stamp 70 and the submaster 50. If the artisan finds it difficult to lift or tilt the leveler 60 without disrupting the contact between the stamp 70 and the submaster 50, it may be convenient to temporarily remove one of the ends 32 and slide the leveler 60 away sideways in a direction substantially parallel to the plane defined by the tops of the spacers.

Further, in this view the liner 62 is being peeled away from the stamp 70. This should be done very gently so as not to disrupt the contact between the stamp 70 and the submaster 50. A large peel angle, such as greater than 90 degrees, when peeling the liner as illustrated in the Figure has generally given good results. It will be appreciated in FIG. 12 that a raised periphery 72 of the hardened stamp-forming material still surrounds and is connected with the hardened stamp 70, forming a shallow, confined zone 74 having the shape of leveler 60 above the stamp 70. Confined zone 74 is convenient, as will be appreciated in connection with FIG. 13.

Figure 13:
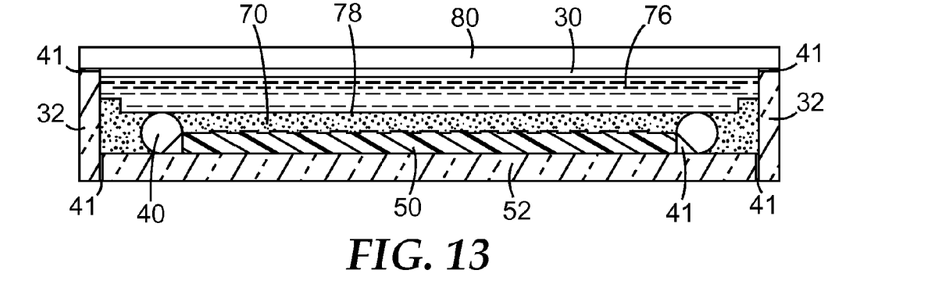
FIG. 13 is a side cross-section view similar to FIG. 12, except that a quantity of inking material has been placed in contact with the stamp.

Referring now to FIG. 13, a side cross-section view similar to FIG. 12 is illustrated, except that a quantity of inking material 76 has been placed in contact with the backside 78 (the side opposite of the features) of stamp 70 and allowed to soak into the stamp. A cover 80 has been conveniently positioned to prevent any volatile components of the inking material from evaporating away. It is significant that the inking material 76 is entering the stamp 70 while it is still supported by and physically in contact with submaster 50. During the diffusion of inking material 76 into stamp 70, the concentration of inking material will not be equal in all parts of the stamp. This inequality results in small stresses that could distort the pattern of the stamp. However, the contact with the submaster 50 helps the pattern resist distortion until the inking material 76 is evenly distributed within the stamp.

Chemical species that are suitable in inking materials useful in connection with the present invention form self-assembled monolayers. These include organic compounds such as organosulfur compounds, silanes, phosphonic acids, benzotriazoles, and carboxylic acids. Examples of such compounds are discussed in the review by Ulman (A. Ulman, "Formation and Structure of Self-Assembled Monolayers," Chem. Rev. 96 1533-1554 (1996)). In addition to organic compounds, certain organometallic compounds are useful for forming self-assembled monolayers. Examples of organosulfur compounds that are suitable for forming selfassembled monolayers include alkyl thiols, dialkyl disulfides, dialkyl sulfides, alkyl xanthates, and dialkylthiocarbamates. Examples of silanes that are suitable for forming self-assembled monolayers include organochlorosilanes and organoalkoxysilanes. Examples of phosphonic acid molecules that are suitable for forming self-assembled monolayers are discussed by Pellerite et al. (M. J. Pellerite, T. D. Dunbar, L. D. Boardman, and E. J. Wood, "Effects of Fluorination on Self-Assembled Monolayer Formation from Alkanephosphonic Acids on Aluminum: Kinetics and Structure," Journal of Physical Chemistry B 107 11726-11736 (2003)). Chemical species that are suitable for forming self-assembled monolayers can include, for example, hydrocarbon compounds, partially fluorinated hydrocarbon compounds, or perfluorinated compounds. The self-assembled monolayer can include two or more different chemical species. In the use of two or more different chemical species, the chemical species may exist in the self-assembled monolayer as a mixture or with a phase-separated morphology.

Illustrative useful molecules for forming a self-assembled monolayer include, for example, (C3-C20) alkyl thiols, (C10-C20) alkyl thiols or (C15-C20) alkyl thiols. The alkyl groups can be linear or branched and can be substituted or unsubstituted with substituents that do not interfere with the formation of a self-assembled monolayer.

In many convenient embodiments alkanethiols will be useful as inking materials. Pure thiol or thiol diluted in a solvent can be used. Solvents that can be used for making a solution of self-assembling materials include ethanol, acetone, toluene, chloroform, hexane, hexadecane, ethyl acetate, dimethylformamide, and tetrahydrofuran. When a solution is used, it may be a concentrated, e.g. 10 mmol, 100 mmol, or even 200 mmol. More specifically, in some convenient embodiments, a 200 mmol solution of C16 thiol in ethanol was allowed to saturate into the backside 78 of the stamp 70 while the stamp was attached to an epoxy submaster 50. Enough time should be allowed for the inking material 76 to saturate the stamp 70, but excessively long inking times do not give best results. Inking times over 24 hours have been unexpectedly found to result in poorer replication of the pattern of the submaster 50 onto the printing substrate. Inking saturation times of around three hours have been found to be suitable.

One of the most economically important considerations in micro-contact printing is to enable the largest number of prints per single stamp while maintaining dimensional stability of the prints. It has been discovered that the number of prints per single stamp while maintaining dimensional stability of the prints can be maximized by optimizing the thickness of the stamp. This is for this reason it was mentioned above that the height of the spacers 40 supporting the leveler 60 needed to be chosen with deliberation. In general, the thickness of the stamp can be in the range from 0.5 mm to 10 mm, but within this general guidance the thickness can be optimized for a choice of self-assembling ink and ink concentration. For many convenient embodiments, the optimized thickness is in the range of 2 to 4 mm.

For example, for a C18 thiol diffusion at a concentration of 15 mmol in a PDMS stamp, a stamp thickness of 3 mm is believed to be optimum. At that thickness more than 2000 imprints with a pre-saturated stamp was shown to be possible. While it is unsurprising that stamps with a thickness of 0.5 mm to 2 mm produced fewer prints than a stamp of 3 mm, counter intuitively, only 800 imprints were shown to be possible with 5 mm stamp. Further it was discovered that enlarging the stamp thickness to more than 3 mm not only did not lead to an increase in maximum number of prints, but could lead to problems related to pattern distortion believed to be due to stresses generated during stamp curing and saturation.

In order for micro-contact printing to work, the ink of self-assembling molecules needs to diffuse from the bulk of the stamp to the stamp surface and leave the stamp at the stamp/printing substrate interface. At that interface molecules self-assemble in a dense monolayer that works as e.g. an etch resist for the printing substrate. In general, the rate of diffusion of the ink through the stamp and the rate at which the ink is lost at the stamp surface during printing are going to be different. While not intending to be bound by a particular theory, it is thought that the observation that thicker stamps do not necessarily produce a greater number of imprints is because the ink has a high affinity for the printing substrate such that the ink leaves the stamp almost instantaneously after the stamp contacts the metal surface. Because of that, it is believed that during contact with the printing substrate, right at the surface of the stamp, the concentration of the ink is very low. That low surface concentration of the ink leads to an ink concentration gradient and diffusion of the ink from the bulk of the stamp to the surface. That diffusion is what replenishes ink at the surface and enables multiple prints. In a thicker stamp, the ink diffuses too slowly to the printing surface.

Figure 14:
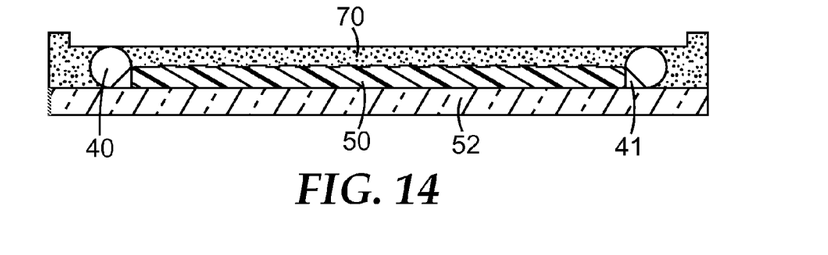
FIG. 14, a side cross-section view similar to FIG. 13, except that the cover has been removed, excess inking material has been poured off, and the sides and ends of the tray have been taken away.

Referring now to FIG. 14, a side cross-section view similar to FIG. 13 is illustrated, except that sufficient time has elapsed, the cover (80 in FIG. 13) has been removed, excess inking material (76 in FIG. 13) has been poured off, and the sides and ends (30 and 32 respectively in FIG. 13) have been taken away.

Figure 15:
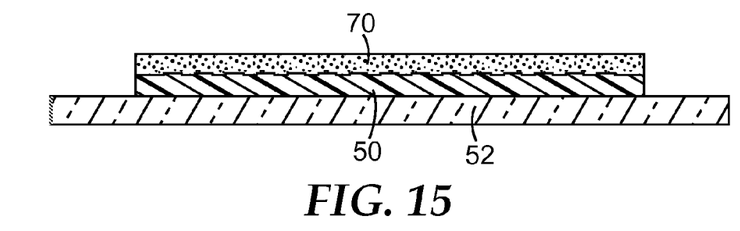
FIG. 15 is a side cross-section view similar to FIG. 14, except that the spacers, the temporary adhesive that maintained them in position have been removed, and hardened stamp-forming material extraneous to the stamp has been carefully cut away.

Referring now to FIG. 15, a side cross-section view similar to FIG. 14 is illustrated, except that the spacers 40, the temporary adhesive 41 that maintained them in position have been removed, and hardened stamp-forming material extraneous to the stamp 70, including the material that formed confined zone 74 in FIG. 12, has been carefully cut away. In this view, a fully inked stamp 70, still in contact with the submaster 50, is illustrated. The inked stamp 70 stands ready to be mounted for micro-contact printing. The inked stamp 70 may be mounted for printing in any of the known arrangements for flexographic printing, e.g. with the stamp mounted on a flat surface or a round printing roll, and mounted via adhesive, magnetic, or vacuum means.

Figure 16:
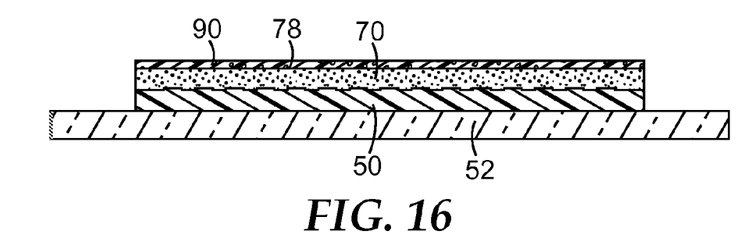
FIG. 16 is a side cross-section view similar to FIG. 15, except that an attachment layer has been applied to the backside of the stamp.

Mounting the stamp 70 by adhesive means is often convenient. Referring now to FIG. 16, a side cross-section view similar to FIG. 15 is illustrated, except that an attachment layer 90 has been applied to the backside of stamp 70. The attachment layer can be, e.g. a layer of transfer adhesive, a layer of double-sided adhesive foam, or a layer of double-side film tape. One suitable transfer adhesive is a 2 mil (0.05 mm) thick layer of silicone adhesive transfer adhesive on a 2 mil (0.05 mm) thick polyester film liner commercially available as 3M SILICONE ADHESIVE TRANSFER TAPE 9122 from 3M Company. As is usual with transfer adhesives, the liner is used to manipulate the adhesive layer into place, and is then stripped away to expose the second adhesive side of the adhesive layer. Suitable double-sided adhesive foams include 3M CUSHION-MOUNT PLUS tapes commercially available from 3M Company. Suitable double-side film tapes include 5 mil (0.13 mm) thick double coated tape having a 2 mil (0.05 mm) thick layer of silicone adhesive on either side of a 1 mil (0.025 mm) thick polyester carrier commercially available as 3M DOUBLE COATED TAPE 96042 from 3M Company.

In the alternative when an adhesive attachment is wanted, a layer of transfer adhesive, a layer of double-sided adhesive foam, or a layer of double-side film tape can be attached to the printing roll or support plate, and the backside 78 of the stamp 70 left bare to contact it.

Figure 17:
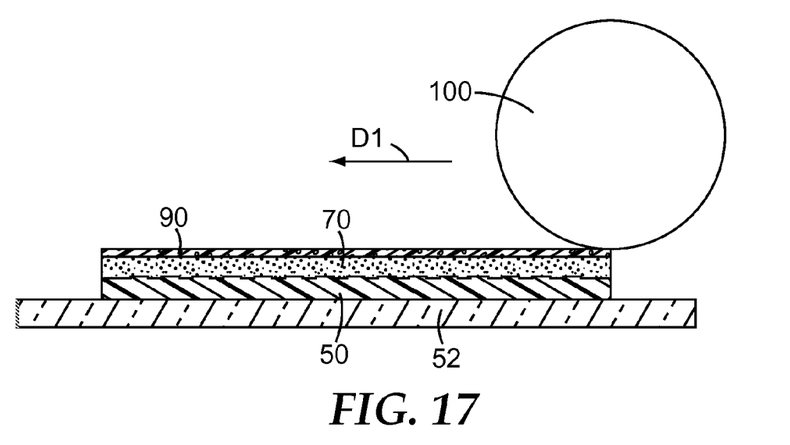
FIG. 17 is a schematic side view of a procedure for transferring the inked stamp to a printing roll.

Referring now to FIG. 17, a schematic side view of a procedure for transferring the inked stamp with an attachment layer 90 adhered to it to a printing roll 100 is illustrated. In the procedure of FIG. 17, the printing roll 100 brought into tangential contact with one end of the attachment layer 90, then printing roll 100 and stamp 70 are moved relative to each other in direction "D1," adhering the stamp 70 to the printing roll 100 and peeling it from submaster 50. Friction between the attachment layer 90 and the roll 100 may rotate the roll 100, or the printing roll 100 may be placed into rotary motion, with the submaster 50 driven at the same linear velocity as the surface velocity of the printing roll 100. Application of the micro-contact printing stamp to the roll was accomplished using a carriage having an upper platen on which the stamp was supported. The upper platen could be raised and lowered for vertical Z translation by a low friction pneumatic cylinder positioned between the upper platen and the carriage. The carriage was moved along linear bearings in the X direction by an actuator. As the carriage was translated, the roll was rotated and the stamp was transferred to the roll and adhered with adhesive to the surface of the roll. Other methods, including positioning or placing by hand can be used to mount the stamp to the roll, but may introduce undesired distortion in the micro-contact printing stamp.

Figure 18:
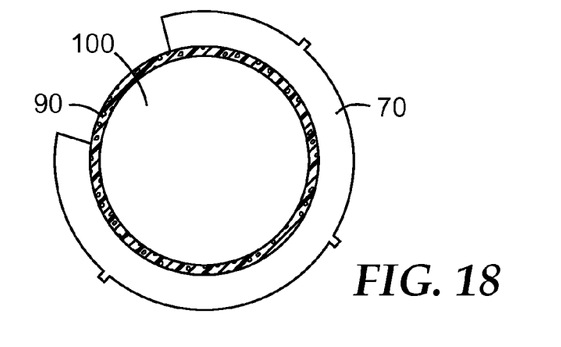
FIG. 18 is a schematic side view of a roll bearing the inked stamp after the procedure of FIG. 17 has been performed.

Referring now to FIG. 18, a schematic side view of printing roll 100 bearing the inked stamp 70 after the procedure of FIG. 17 has been performed, is illustrated. Depending on the application, the printing roll 100 can be an idler or driven roll of conventional type, or the printing roll 100 can be thin shell mounted on an air bearing as described in, "Apparatus and Method for Microcontact Printing on Indefinite Length Webs," filed on Jun. 30, 2011 and having U.S. Ser. No. 61/503,204.

Once the stamp 70 has been mounted, it can be used for printing. The stamp 70 is brought into physical contact with the substrate to be printed, and the ink is transferred to the substrate. The ink is area-selectively transferred to the surface based on the features of the stamp. During the transfer the carbon chains of the ink align with each other to create a hydrophobic self-assembling monolayer.

The method of the present invention is conveniently used for printing onto an indefinite length web of polymeric material such as polyolefin, polyester phthalate, and polyimide films. Metallic surfaces or layers on the film can also be used as printing substrates in connection with the present invention. The metallic surface can include, for example, elemental metal, metal alloys, intermetallic compounds, metal oxides, metal sulfides, metal carbides, metal nitrides, and combinations thereof. Exemplary metallic surfaces for supporting self-assembled monolayers include gold, silver, palladium, platinum, rhodium, copper, nickel, iron, indium, tin, tantalum, as well as mixtures, alloys, and compounds of these elements.

While the invention has been particularly shown and described with reference to various embodiments thereof, it will be understood by those skilled in the art that various other changes in the form and details may be made therein without departing from the spirit and scope of the invention.

What is claimed is:

1. A method of preparing a patterned micro-contact printing stamp for micro contact printing, comprising:
   providing a master of the desired pattern;
   applying stamp forming material to the master;
   hardening the stamp forming material to form a micro-contact printing stamp; and
   placing a quantity of an inking material on the micro-contact printing stamp and exposing the micro-contact printing stamp to the inking material while the micro-contact printing stamp is still in contact with the master, wherein the inking material comprises chemical species that form self-assembled monolayers.

2. A method of preparing a patterned micro-contact printing stamp for micro contact printing, comprising:
   providing a master of the desired pattern;
   applying negative-making material to the master to obtain a negative of the desired pattern;
   preparing a submaster from the negative;
   applying stamp forming material to the submaster;
   hardening the stamp forming material to form a micro-contact printing stamp; and
   placing a quantity of an inking material on the micro-contact printing stamp and exposing the micro-contact printing stamp to the inking material while the stamp is still against the submaster, wherein the inking material comprises chemical species that form self-assembled monolayers.

3. A method according to claim 1 wherein the master is a photoresist on glass.

4. A method according to claim 1 wherein the master comprises a metal.

5. A method according to claim 2 wherein the submaster comprises epoxy.

6. A method according to claim 1 wherein the inking material is a thiol solution.

7. The method according to claim 1 wherein the inking material is placed on the backside of the micro-contact printing stamp opposite the side in contact with the master.

8. The method according to claim 2 wherein the inking material is placed on the backside of the micro-contact printing stamp opposite the side in contact with the submaster.

9. A method according to claim 8 wherein the micro-contact printing stamp is saturated with inking material for approximately three hours.

10. A method according to claim 8 wherein the inking material comprises neat thiol.

11. A method according to claim 8 wherein the inking material comprises thiol with a solvent.

12. A method according to claim 1 wherein the stamp forming material is selected from the group consisting of silicone polymers, epoxy polymers, and acrylate polymers.

13. A method according to claim 2 wherein the applying stamp forming material to the submaster comprises:
   placing a plurality of spacers on the submaster;
   depositing a quantity of stamp forming material on the submaster,
   placing a leveler on the spacers; and wherein
   the hardening the stamp forming material to form a micro-contact printing stamp comprises:
      curing the stamp forming material against the submaster; and
      removing the leveler.

14. A method according to claim 13 wherein the leveler comprises a sheet of glass and a liner placed thereon, and wherein removing the leveler comprises:
   sliding the sheet of glass away in a direction substantially parallel to the plane defined by the tops of the spacers, and
   peeling the liner away from the micro-contact printing stamp.

15. A method according to claim 14 further comprising adhering an attachment layer to the micro-contact printing stamp.

16. A method according to claim 15 wherein the attachment layer is selected from the group consisting of a layer of transfer adhesive, a double-sided film tape, and a double-sided foam tape.

17. A method according to claim 2 further comprising transferring the micro-contact printing stamp directly from the submaster to a printing roll.

18. A method according to claim 17 wherein the printing roll has an attachment layer adhered thereon, and wherein the attachment layer is selected from the group consisting of a layer of transfer adhesive, a double-sided film tape, and a double-sided foam tape.

19. A method according to claim 17 wherein the transferring comprises placing the inked micro-contact printing stamp in contact with the printing roll and placing both the submaster and the printing roll into motion, adhering the inked micro-contact printing stamp onto the printing roll and peeling the inked micro-contact printing stamp from the submaster.

20. A method according to claim 19 wherein the submaster is moved at the same linear velocity as the surface velocity of the printing roll.

21. A method according to claim 7 wherein the micro-contact printing stamp has a thickness between about 0.5 to 10 mm.

22. A method according to claim 21 wherein the micro-contact printing stamp has a thickness between about 2 to 4 mm.

* * * * *

UNITED STATES PATENT AND TRADEMARK OFFICE
CERTIFICATE OF CORRECTION

PATENT NO. : 9,701,045 B2
APPLICATION NO. : 14/116376
DATED : July 11, 2017
INVENTOR(S) : Jonathan O'Hare It is certified that error appears in the above-identified patent and that said Letters Patent is hereby corrected as shown below:

In the Specification

Column 4
Line 10-11, Delete "performed;" and insert -- performed. --, therefor.

Column 10
Line 11 (approx.), Delete "in," and insert -- in copending and coassigned U.S. Patent application attorney docket no. 67383US002, --, therefor.

Signed and Sealed this
Second Day of January, 2018

Joseph Matal
*Performing the Functions and Duties of the
Under Secretary of Commerce for Intellectual Property and
Director of the United States Patent and Trademark Office*